US010571201B2

(12) United States Patent
Meyer, IV et al.

(10) Patent No.: US 10,571,201 B2
(45) Date of Patent: Feb. 25, 2020

(54) HEAT PIPE WITH NON-CONDENSABLE GAS

(71) Applicant: Celsia Technologies Taiwan, Inc., Taoyuan County (TW)

(72) Inventors: George A. Meyer, IV, Morgan Hill, CA (US); Chien-Hung Sun, Taoyuan County (TW)

(73) Assignee: CELSIA TECHNOLOGIES TAIWAN, INC., Taoyuan County (TW)

( * ) Notice: Subject to any disclaimer, the term of this patent is extended or adjusted under 35 U.S.C. 154(b) by 132 days.

(21) Appl. No.: 15/828,559

(22) Filed: Dec. 1, 2017

(65) Prior Publication Data

US 2019/0170447 A1 Jun. 6, 2019

(51) Int. Cl.
*F28D 15/02* (2006.01)
*H05K 7/20* (2006.01)

(52) U.S. Cl.
CPC ..... *F28D 15/0275* (2013.01); *F28D 15/0233* (2013.01); *H05K 7/202* (2013.01); *H05K 7/20127* (2013.01)

(58) Field of Classification Search
CPC ............ F25D 15/0275; F25D 15/0233; H01L 23/427; H05K 7/20127; H05K 7/202; F28D 15/0275; F28D 15/0233
See application file for complete search history.

(56) References Cited

U.S. PATENT DOCUMENTS

2017/0356694 A1* 12/2017 Tan ..................... F28D 15/0233

FOREIGN PATENT DOCUMENTS

| CN | 105045311 A | 11/2015 |
|---|---|---|
| CN | 205031016 U | 2/2016 |
| CN | 207369503 U | 5/2018 |
| WO | 2016/032759 A1 | 3/2016 |

OTHER PUBLICATIONS

Office Action dated Dec. 5, 2019 of the corresponding China patent application No. 201710909160.1.

* cited by examiner

*Primary Examiner* — Marc E Norman
(74) *Attorney, Agent, or Firm* — Chun-Ming Shih; HDLS IPR Services

(57) ABSTRACT

A heat pipe with a non-condensable gas includes a thermal conductor, and a working fluid and a non-condensable gas filled into a hollow chamber of the thermal conductor, and the thermal conductor has a heat-absorbing side attached to a heat-generating electronic component and an exothermal side attached to a radiator, and the exothermal side has at least one protrusion, and the exothermal side with the protrusion can reduce the contact area with the radiator, and the heat pipe lowers the conduction efficiency by the non-condensable gas and the protrusion, so as to achieve a work efficiency of the heat-generating electronic component in an operation within a working temperature range.

8 Claims, 3 Drawing Sheets

HEAT PIPE WITH NON-CONDENSABLE GAS

BACKGROUND OF THE INVENTION

1. Technical Field

This disclosure generally relates to the field of heat pipes, and more particularly to a heat pipe with a non-condensable gas.

2. Description of Related Art

In the working principle of a general heat pipe, the heat pipe provides an internal vacuum environment filled with a working fluid and produces a phase change when the working fluid is heated, so as to transfer heat. After the working fluid is cooled, the working fluid returns to its liquid state and backflows for recycle and reuse. An evaporating end surface of the heat pipe is attached to a surface of a heat-generating electronic component, so that the heat produced by the electronic component may be absorbed by the evaporating end surface of the heat pipe and then conducted to the radiator through the heat pipe to achieve the heat dissipation effect.

In a conventional heat pipe, the internal structure is situated at a vacuum status, and no non-condensable gas is in the heat pipe, so that the thermal conduction efficiency of the heat pipe is improved to achieve the effect of cooling the heat-generating components quickly in a short time. However, in a special using environment (such as a very cold environment), the good thermal conduction efficiency of the heat pipe may cause a failure for the electronic component to reach an appropriate working temperature, so that the electronic component will be unable to maximize its work efficiency. Therefore, it is a subject for related manufacturers to provide a heat pipe that does not operate when the temperature of the heat-generating electronic component is low, and starts operating when the temperature of the heat-generating electronic component is high, so as to achieve the effect of operating the heat pipe in a specific working temperature range.

In view of the aforementioned drawbacks of the prior art, the discloser of this disclosure based on years of experience to conduct extensive research and experiment, and finally provided a feasible solution to overcome the drawbacks of the prior art.

SUMMARY OF THE INVENTION

Therefore, it is a primary objective of this disclosure to provide a heat pipe with a non-condensable gas, and the heat pipe does not operate when the temperature of the heat-generating electronic component is low, and starts operating when the temperature of the heat-generating electronic component is high, so as to achieve the effects of reducing the conduction efficiency of the heat pipe and operating the heat pipe in a specific working temperature range. As a result, the heat-generating electronic component achieves the desired work efficiency.

To achieve the aforementioned and other objectives, this disclosure provides a heat pipe with a non-condensable gas, comprising: a thermal conductor; and a working fluid and a non-condensable gas, filled into the heat pipe. The thermal conductor has a hollow chamber with a heat-absorbing side attached to a heat-generating electronic component and an exothermal side thermally conductively coupled to a radiator, and the exothermal side has at least one protrusion formed thereon, and the exothermal side can reduce the contact area with the radiator by the protrusion, and the heat pipe can lower the conduction efficiency by the non-condensable gas and protrusion, so that the heat pipe can operate at a working temperature range to achieve the desired work efficiency of the heat-generating electronic component.

Compared with the prior art, the heat pipe of this disclosure is filled with a non-condensable gas, and the exothermal side has at least one protrusion formed thereon and provided for reducing the contact area with the radiator, so that when the electronic component is situated at an operating status of low working temperature and low work efficiency, the heat pipe will not operate at the initial operation of the heat-generating electronic component since the heat pipe is filled with the non-condensable gas, the contact area with the radiator is reduced, and the thermal conduction efficiency is lowered. As a result, the heat-generating electronic component keeps its generated heat to improve its work efficiency. When the heat-generating electronic component is situated at a higher working temperature, the heat pipe starts operating at the condition of a high work efficiency to dissipate the heat generated by the heat-generating electronic component. Therefore, the heat pipe operates when the conduction efficiency drops to a specific working temperature range, and the heat-generating electronic component is capable of achieving the desired work efficiency and improving the practicality of this disclosure.

DESCRIPTION OF THE PREFERRED EMBODIMENTS

Figure 1:
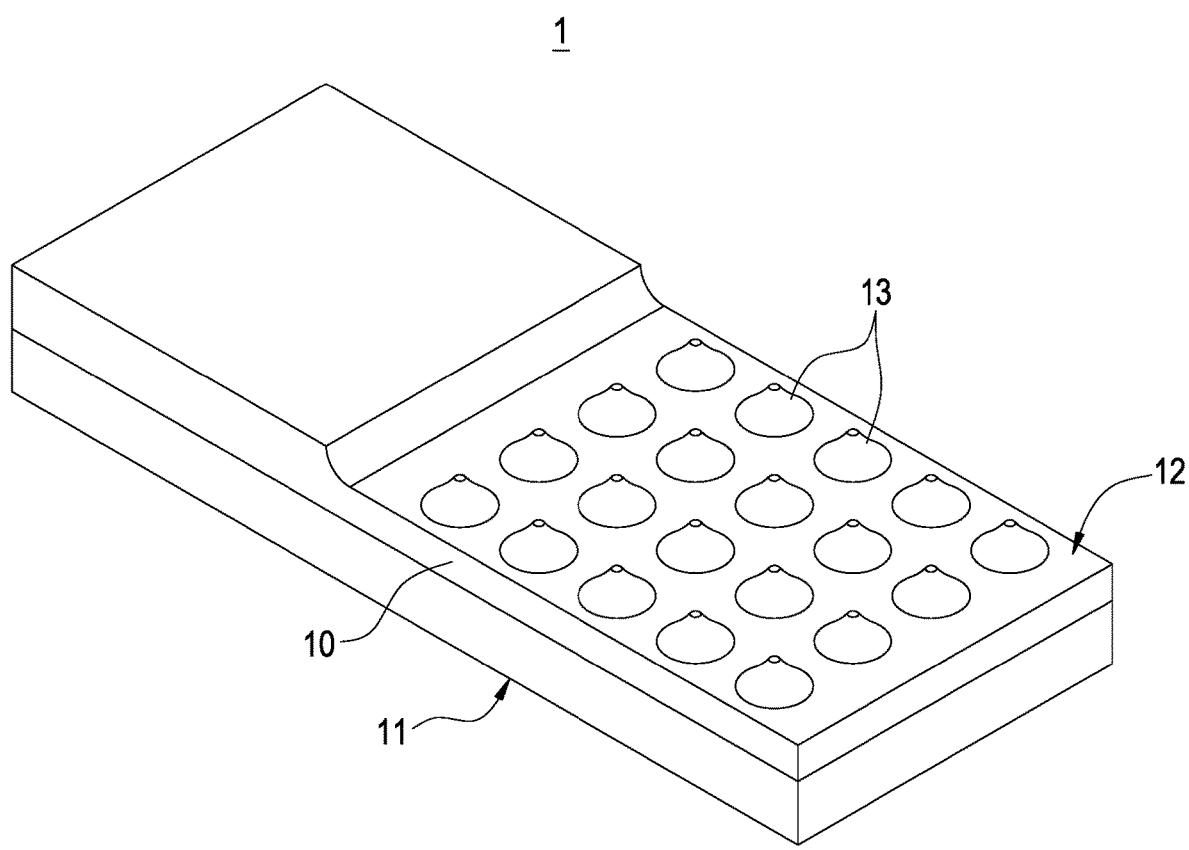
FIG. 1 is a perspective view of a heat pipe with a non-condensable gas of this disclosure.

The technical contents of this disclosure will become apparent with the detailed description of preferred embodiments accompanied with the illustration of related drawings as follows. It is noteworthy that same numerals are used for representing same respective elements in the drawings.

Figure 2:
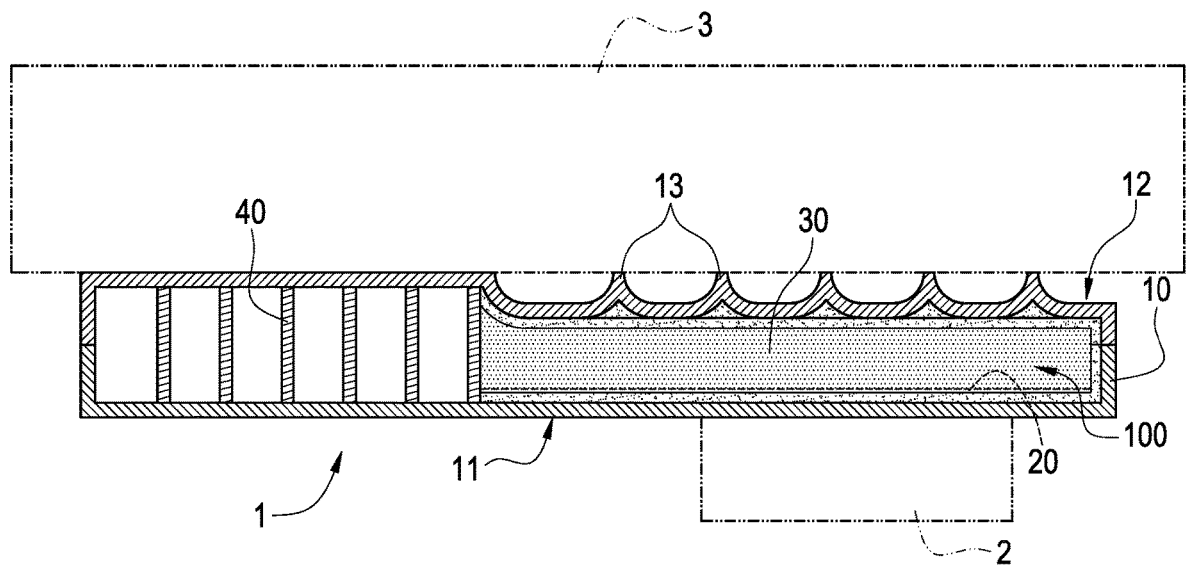
FIG. 2 is a schematic view of an application of a heat pipe with a non-condensable gas of this disclosure.
Figure 3:
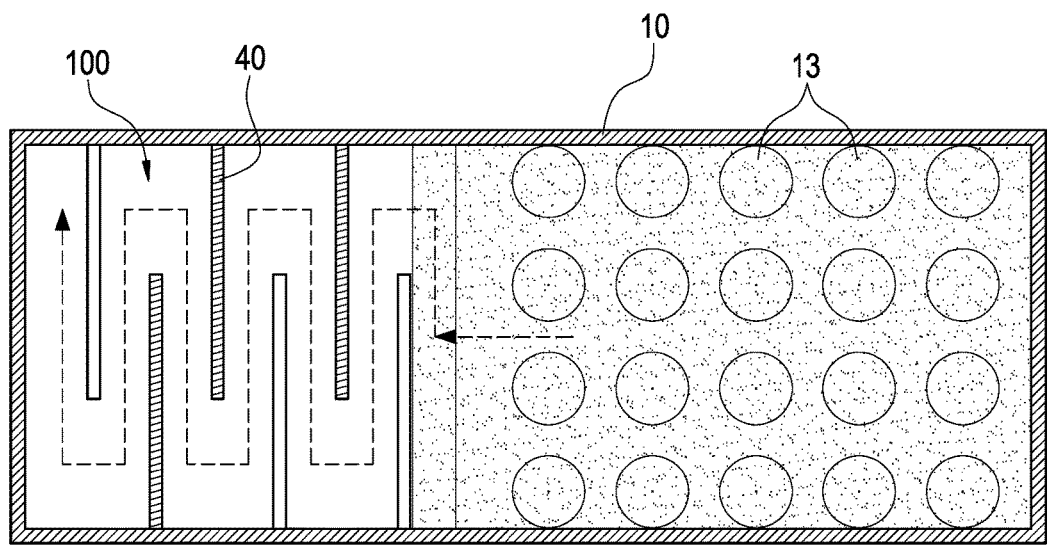
FIG. 3 is a cross-sectional view of a heat pipe with a non-condensable gas of this disclosure.

With reference to FIGS. 1 to 3 for a perspective view, a schematic view and a cross-sectional view of a heat pipe with a non-condensable gas of this disclosure respectively, FIGS. 1 and 2 show that the heat pipe with a non-condensable gas 1 is used for cooling a heat-generating electronic component 2. Preferably, the heat pipe 1 is combined with a radiator 3. In a preferred embodiment of this disclosure, the radiator 3 is a cooling fin module.

In FIGS. 2 and 3, the heat pipe 1 of this preferred embodiment comprises a thermal conductor 10, a working fluid 20, and a non-condensable gas 30, wherein the working fluid 20 and the non-condensable gas 30 are filled into the thermal conductor 10. The structure of the heat pipe 1 will be described in details below.

The thermal conductor 10 has a sealed hollow chamber 100 made of a metal with a good thermal conductivity such as copper. In this preferred embodiment, the thermal conductor 10 is substantially a flat rectangular body, but not limited to such arrangement only. In addition, the thermal conductor 10 has a heat-absorbing side 11 attached to a heat-generating electronic component 2 and an exothermal side 12 thermally conductively coupled to a radiator 3. The exothermal side 12 has at least one protrusion 13 formed thereon, and the exothermal side 12 can reduce the contact area with the radiator 3 by the at least one protrusion 13.

The working fluid 20 is filled into the hollow chamber 100, and the working fluid 20 (in form of a gas or a liquid) flows back and forth between the heat-absorbing side and the exothermal side, and continues performing a phase change between gas and liquid, so that the thermal conductor 10 has a quick temperature homogenization feature to achieve the thermal conduction effect. It is noteworthy that the type of the working fluid 20 may be selected according to the using requirements.

In addition, the non-condensable gas 30 is filled into the hollow chamber 100. Preferably, the non-condensable gas 30 is air. The non-condensable gas 30 in the thermal conductor 10 does not participate in the liquid-gas circulation, so that the existence of the non-condensable gas 30 will cause an increased start temperature of the heat pipe 1. In addition, when the heat pipe 1 is operated, the non-condensable gas 30 is compressed by the fluid in the vapor phase to a condensing end to occupy a specific volume of the chamber, so that the thermal conductor 10 has a significant temperature difference between the effective operating section and a non-condensed gas section, and thus affecting the thermal conduction efficiency.

Therefore, the heat pipe 1 lowers its conduction efficiency by the non-condensable gas 30 and the at least one protrusion 13 and operates at a specific working temperature range, and the heat-generating electronic component achieves its desired work efficiency.

Specifically, the at least one protrusion 13 is disposed on the exothermal side 11 and at an end proximate to the heat-generating electronic component 2. Preferably, the at least one protrusion 13 comes with a plural quantity, and the protrusions 13 are disposed with an interval apart from one another, and substantially in a wavy shape.

In a preferred embodiment of this disclosure, the at least one protrusion 13 is protruded from an inner wall of the thermal conductor 10 and in a direction towards an outer side of the thermal conductor 10, and the exothermal side 12 of the thermal conductor 10 has a rugged surface provided for reducing the contact area of the exothermal side 12 with the radiator 3 to lower the heat dissipation efficiency. Therefore, the start temperature of the heat pipe 1 is increased, and the heat pipe 1 can operate again when the temperature of the heat-generating electronic component 2 increases.

In other words, when the heat-generating electronic component 2 is situated at an initial operating status of low working temperature and low work efficiency, the heat pipe 1 does not operate, and the heat-generating electronic component 2 maintains its generated heat to improve its work efficiency. It is noteworthy that the temperature difference of the heat-absorbing side 11 and the exothermal side 12 is large at this moment.

On the other hand, after the heat-generating electronic component 2 has been operated for a period of time, the heat-generating electronic component 2 will be situated at the status of higher working temperature and work efficiency. Now, the heat pipe 1 starts operating to dissipate the heat generated by the heat-generating electronic component 2. It is noteworthy that both of the heat-absorbing side 11 and the exothermal side 12 are situated at a homogenized temperature status and have no temperature difference. In other words, the heat pipe 1 does not operate at a low temperature by means of reducing the conduction efficiency of the heat pipe 1 and starts operating to dissipate the generated heat at a specific temperature.

With reference to FIG. 3 for the heat pipe 1 in accordance with a preferred embodiment of this disclosure, the heat pipe 1 further comprises a plurality of blocking portions 40. The blocking portions 40 are staggered with respect to each other and disposed in the hollow chamber 100 and thus are capable of extending the flow path of the working fluid 20 (in form of vapor) in the hollow chamber 100 to increase the condensation time of the working fluid 20 and lower the thermal conversion efficiency.

In a preferred embodiment of this disclosure, the blocking portions 40 are disposed in the hollow chamber 100 and at an end of the thermal conductor 10 away from the heat-generating electronic component 2. In addition, the blocking portions 40 are plates coupled to an inner wall surface of the thermal conductor 10. Specifically, the blocking portions 40 are staggered with respect to each other and formed into a plurality of mutually communicating U-shaped loops. However, this disclosure is not limited to such arrangement only.

Figure 4:
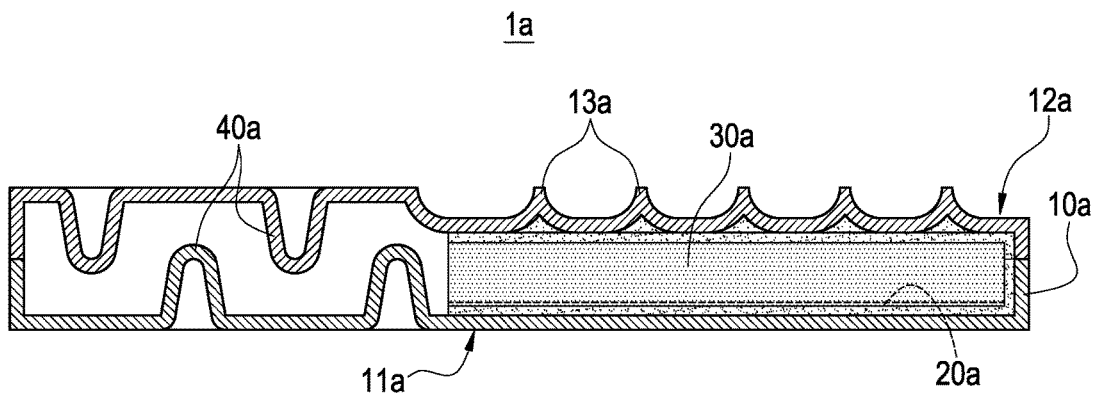
FIG. 4 is a schematic view of a blocking portion of a heat pipe with a non-condensable gas of this disclosure.

With reference to FIG. 4 for another implementation mode of a blocking portion of a heat pipe of this disclosure, this preferred embodiment is substantially the same as the previous preferred embodiment, and the heat pipe 1a comprises a thermal conductor 10a, a working fluid 20a, a non-condensable gas 30a and a plurality of blocking portions 40a. The thermal conductor 10a has a heat-absorbing side 11a and an exothermal side 12a. The exothermal side 12a has at least one protrusion 13a formed thereon. The working fluid 20a and the non-condensable gas 30a are filled into the thermal conductor 10a. The blocking portions 40a are staggered with respect to each other and disposed in the thermal conductor 10a to form a plurality of mutually communicating U-shaped loops.

The difference between this preferred embodiment and the previous preferred embodiment resides on the arrangement of the blocking portions 40a. In this preferred embodiment, the blocking portions 40a are concavely extended in a direction from the inner wall of the thermal conductor 10a towards the interior of the thermal conductor 10 and provided for extending the flow path of the working fluid 20a (in the vapor form) in the thermal conductor 10a and increasing the condensation time of the working fluid 20a, so as to lower the thermal conversion efficiency.

Figure 5:
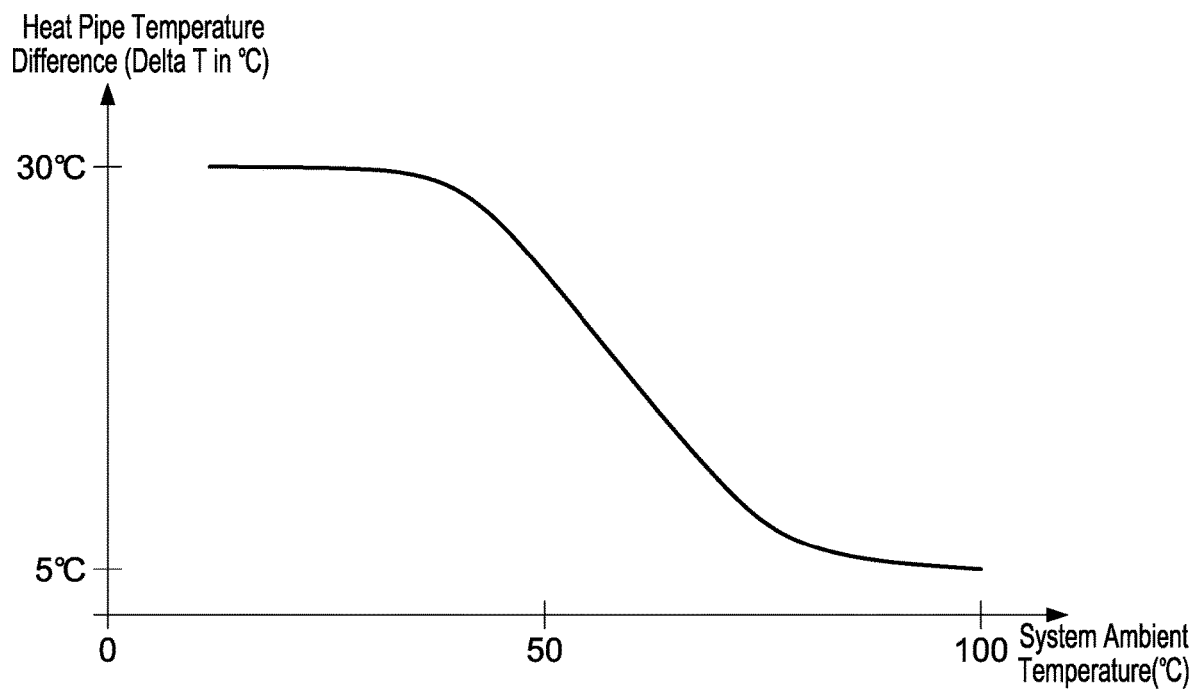
FIG. 5 is a graph of temperature difference versus power percentage of a heat-generating electronic component when a heat pipe is used in accordance with this disclosure.

With reference to FIG. 5 for a graph of temperature difference versus system ambient temperature when a heat pipe is used in accordance with this disclosure, when the system ambient temperature is low, the heat pipe 1,1a will not initialize the heat dissipation mechanism due to the existence of the non-condensable gas 30, 30a. On the other hand, when the system ambient temperature rises, the heat pipe 1,1a initializes the heat dissipation mechanism, so that the temperature delta of the heat pipe 1,1a gradually drops to a specific temperature such as 5° C. Therefore, the heat pipe 1,1a of this disclosure operates in a working temperature range, and the heat-generating electronic component is maintained to operate in a temperature range stably to maximize its work efficiency.

While this disclosure has been described by means of specific embodiments, numerous modifications and variations could be made thereto by those skilled in the art without departing from the scope and spirit of this disclosure set forth in the claims.

What is claimed is:

1. A heat pipe with a non-condensable gas, comprising:
   a thermal conductor, having a hollow chamber, a heat-absorbing side attached to a heat-generating electronic component, and exothermal side thermally conductively coupled to a radiator, and the exothermal side having at least one protrusion formed thereon, and the exothermal side reducing the contact area with the radiator by the at least one protrusion;
   a working fluid, filled into the hollow chamber;
   a non-condensable gas, filled into the hollow chamber, and the heat pipe lowering the conduction efficiency by the non-condensable gas and the at least one protrusion, so that the heat-generating electronic component achieves a work efficiency in an operation within a working temperature range;
   a plurality of blocking portions staggered with respect to each other and disposed in the hollow chamber and capable of extending a flow path of the working fluid, wherein the blocking portions are concavely extended from the inner wall of the thermal conductor and in a direction towards the interior of the thermal conductor.

2. The heat pipe with a non-condensable gas according to claim 1, wherein the at least one protrusion is disposed on the exothermal side and at an end proximate to the heat-generating electronic component.

3. The heat pipe with a non-condensable gas according to claim 1, wherein the at least one protrusion comprises a plurality of protrusions and the protrusions are disposed with an interval apart from one another.

4. The heat pipe with a non-condensable gas according to claim 3, wherein the protrusions are in a wavy shape.

5. The heat pipe with a non-condensable gas according to claim 1, wherein the at least one protrusion is protruded from an inner wall of the thermal conductor and in a direction towards an outer side of the thermal conductor.

6. The heat pipe with a non-condensable gas according to claim 1, wherein the non-condensable gas is air.

7. The heat pipe with a non-condensable gas according to claim 1, wherein the blocking portions are coupled to an inner wall surface of the thermal conductor.

8. The heat pipe with a non-condensable gas according to claim 1, wherein the blocking portions are disposed at an end of the thermal conductor away from the heat-generating electronic component.

* * * * *